US008427154B2

(12) United States Patent
Salomir et al.

(10) Patent No.: US 8,427,154 B2
(45) Date of Patent: Apr. 23, 2013

(54) METHOD AND APPARATUS FOR MAGNETIC RESONANCE GUIDED HIGH INTENSITY FOCUSED ULTRASOUND FOCUSING UNDER SIMULTANEOUS TEMPERATURE MONITORING

(76) Inventors: Rares Salomir, Ambilly (FR);
Jean-Noel Hyacinthe, Armoy (FR);
Viallon Magalie, Lyons (FR)

( * ) Notice: Subject to any disclaimer, the term of this patent is extended or adjusted under 35 U.S.C. 154(b) by 484 days.

(21) Appl. No.: 12/758,151

(22) Filed: Apr. 12, 2010

(65) Prior Publication Data
US 2011/0248714 A1 Oct. 13, 2011

(51) Int. Cl.
*G01V 3/00* (2006.01)
(52) U.S. Cl.
USPC .......................................... 324/309; 324/318
(58) Field of Classification Search .......... 324/300–322; 600/407–445; 372/30; 356/451
See application file for complete search history.

(56) References Cited

U.S. PATENT DOCUMENTS

| | | | | |
|---|---|---|---|---|
| 7,609,731 | B2 * | 10/2009 | Dantus et al. ................... | 372/30 |
| 7,973,936 | B2 * | 7/2011 | Dantus .......................... | 356/451 |
| 8,300,669 | B2 * | 10/2012 | Dantus et al. ................... | 372/25 |
| 2012/0068703 | A1 * | 3/2012 | Gross et al. .................... | 324/309 |
| 2012/0071746 | A1 * | 3/2012 | Vortman et al. ............... | 600/411 |

OTHER PUBLICATIONS

"Transient MR Elastography (t-MRE) Using Ultrasound Radiation Force: Theory, Safety and Initial Experiments in Vitro," Souchon et al., Magnetic Resonance in Medicine, vol. 60 (2008) pp. 871-881.
"Magnetic Resonance Acoustic Radiation Force Imaging," McDannold et al., Medical Physics, vol. 35, No. 8 (2008) pp. 3748-3758.
"Visualizing Tissue Compliance with MR Imaging," Plewes et al., Journal of Magnetic Resonance Imaging, vol. 55 (1995) pp. 733-738.
"Referenceless PRF Shift Thermometry," Rieke, et al., Magnetic Resonance in Medicine, vol. 51 (2004) pp. 1223-1231.
"Transient MR Elastography (t-MRE) Using Ultrasound Radiation Force: Theory, Safety, and Initial Experiments In Vitro," Souchon, et al., Magnetic Resonance in Medicine, vol. 60 (2008) pp. 871-881.
"Magnetic Resonance Acoustic Radiation Force Imaging," McDannold, et al., Medical Physics, vol. 35, No. 8, (2008) pp. 3748-3758.
"Visualizing Tissue Compliance with MR Imaging," Plewes, et al, Journal of Magnetic Resonance Imaging, vol. 5, No. 6 (1995) pp. 733-738.

(Continued)

*Primary Examiner* — Brij Shrivastav
(74) *Attorney, Agent, or Firm* — Schiff Hardin LLP

(57) ABSTRACT

In a method and an apparatus for magnetic resonance guided high intensity focused ultrasound (HIFU), precise localization of the focal point of the HIFU is determined by imaging an examination subject in parallel with GRE sequences that respectively include a positive monopolar gradient pulse and a negative monopolar gradient pulse, that respectively encode the acoustic radiation force (ARF)-induced phase shift that is induced by the simultaneous activation of HIFU during the sequences. A GRE phase image is reconstructed from each acquisition sequence, and a difference image is formed between the two GRE phase images, from which the HIFU focal point is determined. An average image is formed of the two GRE phase images from which PRFS temperature map is determined simultaneously to ARFI map. The use of parallel imaging and the use of partial Fourier reconstruction for reconstructing the GRE phase images allows the data to be acquired sufficiently rapidly so as to minimize the adverse effect of tissue heating that occurs with conventional longer-duration, and repetitious, techniques.

10 Claims, 3 Drawing Sheets

OTHER PUBLICATIONS

"Reference-less PRFS MR Thermometry Using a Thin Open Border And The Harmonic Functions Theory: 2D Experimental Validation," Salomir, et al., ISMRM 2010, Abstract No. 247 (2010).

"Feasibility of Simultaneous Temperature and Tissue Stiffness Detection by MRE," Le, et al., Magnetic Resonance in Medicine, vol. 55 (2006) pp. 700-705.

* cited by examiner

METHOD AND APPARATUS FOR MAGNETIC RESONANCE GUIDED HIGH INTENSITY FOCUSED ULTRASOUND FOCUSING UNDER SIMULTANEOUS TEMPERATURE MONITORING

BACKGROUND OF THE INVENTION

1. Field of the Invention

The present invention concerns magnetic resonance guided high intensity focused ultrasound (MRgHIFU), and in particular concerns a method and an apparatus for focusing high intensity focused ultrasound (HIFU).

2. Description of the Prior Art

One challenge in MRgHIFU is to provide safe and thermally neutral focusing of the HIFU beam pattern using acoustic radiation force imaging (ARFI). The radiation force is localized and highly directional (along the main propagation axis of the HIFU beam) while negligible outside the focal zone. This force initiates a tissue displacement correlated to the amplitude of the acoustic field, and thus produces a phase shift that can be encoded in the MR signal using a motion encoding gradient (MEG) (1) Souchon et al. MRM 2008. (2) Plewes D. B. at al. JMRI 1995. (3) McDannold et al. MedPhys Med. Phys. 35(8):3748-58 (2008). In addition, ARFI also provides "stiffness weighted" images that may allow assessment of pre-therapy versus post-therapy changes in tissue. Since HIFU also causes tissue heating, temperature elevation and RFI effects are always associated, to various degrees.

SUMMARY OF THE INVENTION

An object of the present invention is to provide a method and an apparatus that allows the HIFU focal point to be precisely localized while avoiding, or at least alleviating, the disadvantages of the conventional approaches described above.

This object is achieved in accordance with the present invention by a method and an apparatus wherein a precise localization of the HIFU focal point is obtained by subtracting GRE 2D or 3D phase images from two independent acquisitions, with the Acoustic Radiation Force (ARF)-induced phase shift being sequentially encoded with a positive monopolar MEG pulse and negative monopolar MEG pulse. The MEG must always be orientated along the main direction of HIFU beam propagation. To optimally exploit the elongated shape of the HIFU focal spot, the slice should be orthogonal to the HIFU beam (optimal in plane resolution) and the MEG can be activated along the slice-select direction. Furthermore, the GRE sequence being intrinsically sensitive to temperature elevation by the Proton Resonance Frequency Shift (PRFS) effect, simultaneous temperature monitoring during HIFU focusing is achieved in accordance to the present invention.

The acquisition speed with which the data representing the aforementioned GRE phase images is increased by using GRE-EPI and/or parallel imaging techniques and/or partial Fourier reconstruction, this further reduces the subsequent heating of the examination subject, because fewer HIFU pulses are activated when magnetic resonance signals are acquired, and/or the magnetic resonance reconstruction matrix size is reduced.

DESCRIPTION OF THE PREFERRED EMBODIMENTS

Figure 1:
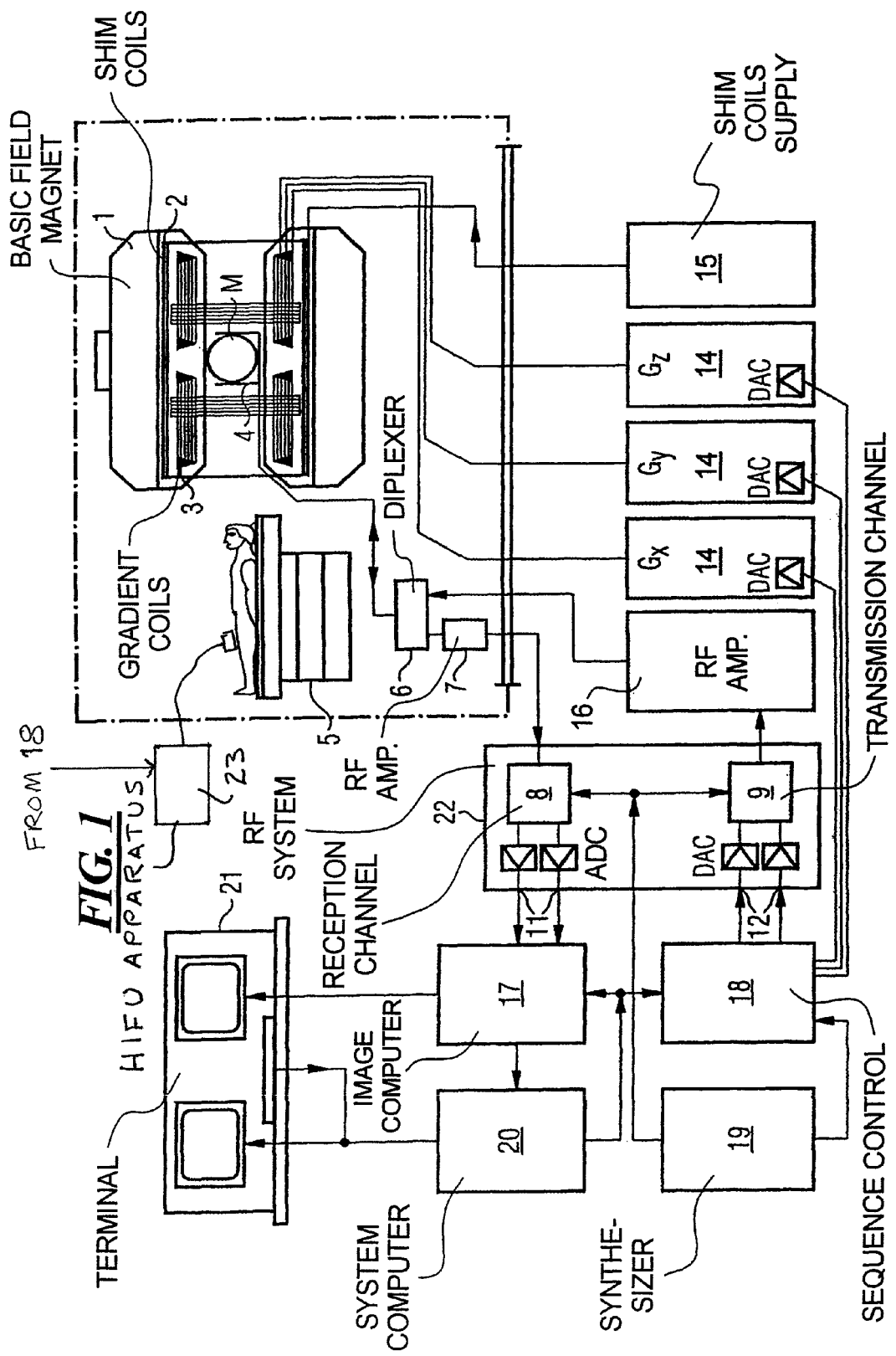
FIG. 1 schematically illustrates a magnetic resonance imaging apparatus constructed and operating in accordance with the present invention.

FIG. 1 is a schematic illustration of a magnetic resonance tomography apparatus operable according to the present invention. The structure of the magnetic resonance tomography apparatus corresponds to the structure of a conventional tomography apparatus, with the differences described below. A basic field magnet 1 generates a temporally constant, strong magnetic field for the polarization or alignment of the nuclear spins in the examination region of a subject such as, for example, a part of a human body to be examined. The high homogeneity of the basic magnetic field required for the magnetic resonance measurement is defined in a spherical measurement volume M into which the parts of the human body to be examined are introduced. For satisfying the homogeneity requirements and, in particular, for eliminating time-invariable influences, shim plates of ferromagnetic material are attached at suitable locations. Time-variable influences are eliminated by shim coils 2 that are driven by a shim power supply 15.

A cylindrical gradient coil system 3 that is composed of three sub-windings is introduced into the basic field magnet 1. Each sub-winding is supplied with current by an amplifier 14 for generating a linear gradient field in the respective direction of the Cartesian coordinate system. The first sub-winding of the gradient field system generates a gradient $G_x$ in the x-direction, the second sub-winding generates a gradient $G_y$ in the y-direction and the third sub-winding generates a gradient $G_z$ in the x-direction. Each amplifier 14 has a digital-to-analog converter that is driven by a sequence controller 18 for the temporally correct generation of gradient pulses.

A radio frequency antenna 4 is situated within the gradient field system 3. This antenna 4 converts the radio frequency pulse output by a radio frequency power amplifier 30 into a magnetic alternating field for exciting the nuclei and alignment of the nuclear spins of the examination subject or of the region of the subject to be examined. The antenna 4 is schematically indicated in FIG. 1. For acquiring magnetic resonance data according to a PPA technique, the antenna 4 is a coil array formed by multiple individual reception coils. The antenna 4 can include a different coil for emitting the RF signals into the subject.

The radio frequency antenna 4 and the gradient coil system 3 are operated in a pulse sequence composed of one or more radio frequency pulses and one or more gradient pulses. The radio frequency antenna 4 converts the alternating field emanating from the precessing nuclear spins, i.e. the nuclear spin echo signals, into a voltage that is supplied via an amplifier 7 to a radio frequency reception channel 8 of a radio frequency system 22. The radio frequency system 22 also has a transmission channel 9 in which the radio frequency pulses for exciting the nuclear magnetic resonance are generated. The respective radio frequency pulses are digitally represented as a sequence of complex numbers in the sequence controller 18 on the basis of a pulse sequence prescribed by the system computer 20. As a real part and an imaginary part, this number sequence is supplied via an input 12 to a digital-to-analog converter in the radio frequency system 22 and from the latter to a transmission channel 9. In the transmission channel 9, the pulse sequences are modulated onto a high-frequency carrier signal having a base frequency corresponding to the resonant frequency of the nuclear spins in the measurement volume.

The switching from transmission mode to reception mode ensues via a transmission-reception diplexer 6. The radio frequency antenna 4 emits the radio frequency pulses for exciting the nuclear spins into the measurement volume M and samples resulting echo signals. The correspondingly acquired nuclear magnetic resonance signals are phase-sensitively demodulated in the reception channel 8 of the radio frequency system 22 and converted via respective analog-to-digital converters into a real part and an imaginary part of the measured signal. An image computer 17 reconstructs an image from the measured data acquired in this way. The management of the measured data, of the image data and of the control programs ensues via the system computer 20. On the basis of control programs, the sequence controller 18 controls the generation of the desired pulse sequences and the corresponding sampling of k-space. In particular, the sequence controller 18 controls the temporally correct switching of the gradients, the emission of the radio frequency pulses with defined phase and amplitude as well as the reception of the magnetic resonance signals. The time base (clock) for the radio frequency system 22 and the sequence controller 18 is made available by a synthesizer 19. The selection of corresponding control programs for generating a magnetic resonance image as well as the presentation of the generated magnetic resonance image ensue via a terminal 21 that has a keyboard as well as one or more picture screens.

The apparatus shown in FIG. 1 operates in accordance with the present invention by virtue of an appropriate pulse sequence (protocol) being entered by an operator via the terminal 22 into the system computer 20 and the sequence control 18.

As also schematically indicated in FIG. 1, the apparatus includes a high intensity focused ultrasound (HIFU) apparatus 23 at least in the context of the present invention, the HIFU apparatus 23 is operated (activated) by a signal from the sequence control 18.

The following describes experiments that were conducted to substantiate the effectiveness and practicality of the method and apparatus in accordance with the present invention.
A FLASH sequence was modified to integrate positive or negative MEG in the slice-select direction (max amplitude=25 mT/m, slew rate (200 T/m/s), duration=6 ms). The total zero-momentum of gradient along the slice-select direction was compensated to null value. The HIFU burst was produced by a 256 multi-element transducer (Imasonic, Besançon, France). Natural focal length and aperture of the transducer are R=130 mm and respectively d=140 mm (f=974 kHz). The MR sequence generated an optical trigger at the end of the slice refocusing gradient. An optic-to-TTL conversion and timer board provided the sonification window for the HIFU generator (IGT, Pessac, France). The HIFU burst was required to the generator $\delta=1$ ms before the MEG and its duration was set to $\Delta t=\delta+\tau=7$ ms. The acoustic power was set each time to $P_a=196$ W (pre-calibrated by balance measurements). Coronal images perpendicular to the HIFU beam were acquired on a 3T MR system (TIM Trio, Siemens AG, Germany). Main imaging parameters were: voxel=1×1×5.0 mm, TR/TE/FA=100 ms/18/35, loop coil (11 cm). Two experiments were performed ex vivo (degassed Turkey muscle): 1) full FOV and full k-space (FOVz=FOVx=128 mm, 128 acquired lines in total, 12.8 s/image) and 2). reduced phase FOV (FOVz=65%) and 75% partial. Fourier (PF) (63 acquired lines in total, 6.3 s/image).

Figure 2:
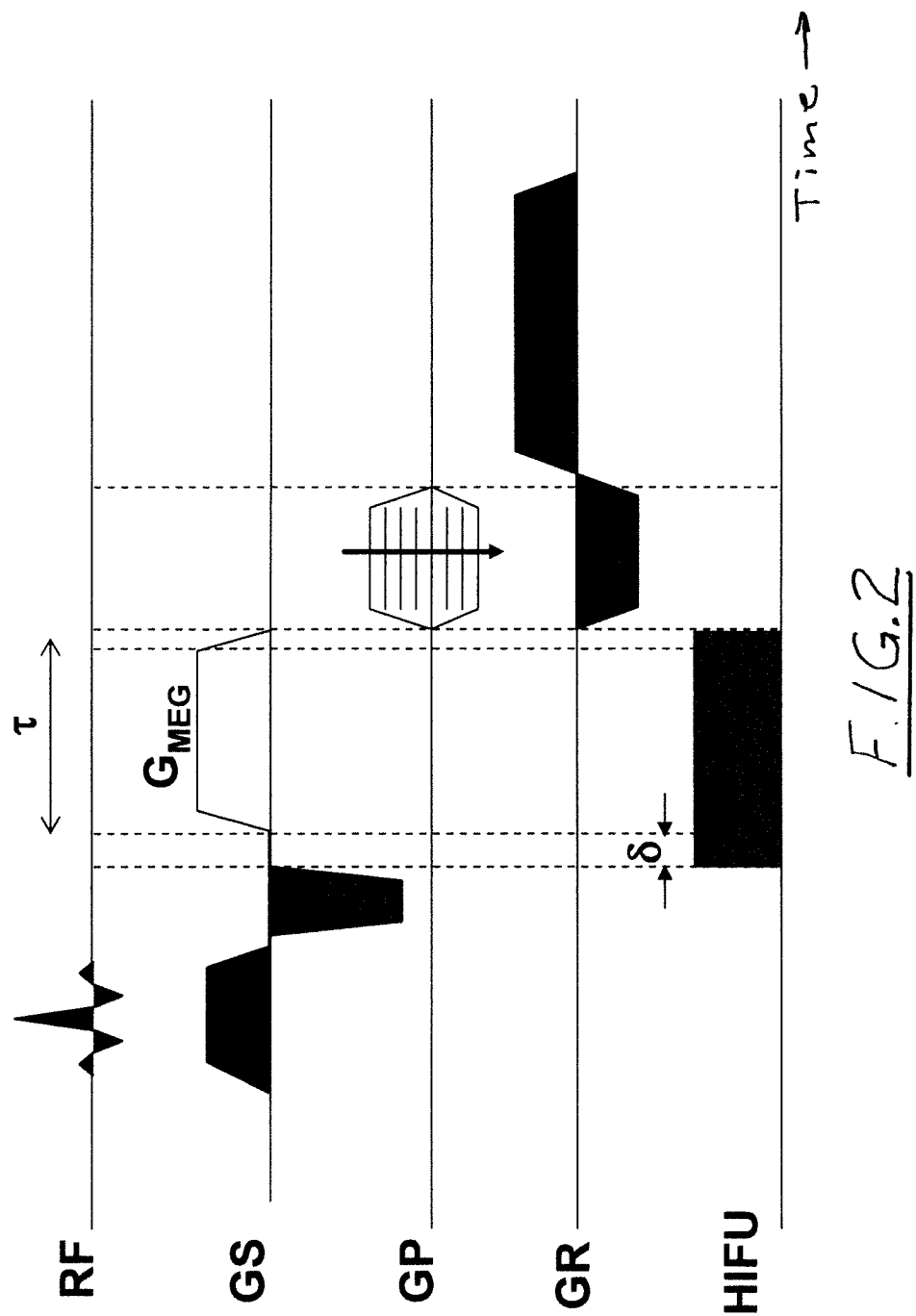
FIG. 2 schematically illustrates an exemplary magnetic resonance pulse sequence in accordance with the present invention.

FIG. 2 is a sequence chronogram for an exemplary pulse sequence in accordance with the present invention, composed of a radio-frequency excitation pulse RF, a slice-selection gradient GS, a phase-encoding gradient GP, a readout gradient GR, and a high intensity focused ultrasound activation HIFU. In this embodiment of the pulse sequence, the positive monopolar gradient pulse and the negative monopolar gradient pulse are activated in the slice-selection direction of the slice-selection gradient GS. This slice-selection gradient GS also embodies a motion encoding gradient $G_{neg}$. The motion-encoding gradient $G_{neg}$ follows the negative monopolar gradient pulse by a time $\delta$, and extends for a time $\tau$(time being indicated horizontally in FIG. 2).

Spoiler gradient may also be used, but are not shown in FIG. 2.

The physical spatial resolution was the same in both experiments and the reduced FOV still largely covered the ARFI contrast region around the focus. Temperature (PRFS-MRT) and ARFI maps were obtained by performing the half-sum and half-difference respectively of the phase-shift images generated with (+) and (−) MEG-polarity. For a monopolar rectangular gradient, the maximum tissue displacement by radiation force can be calculated (2),(3) from $\Delta y=\Delta\Phi)/(\gamma\cdot G_{MEG}\cdot\tau)$ where $\gamma/2\pi$=42.58 MHz/T. The trapezoidal MEG (slew rate=200 T/m/s and rising time=150 µs) was approximated as a rectangular one. Phase unwrapping, temporal subtraction of reference phase background (i.e. without HIFU bursts) and computing of temperature elevation at each pixel were performed in Matlab.

Figure 3:
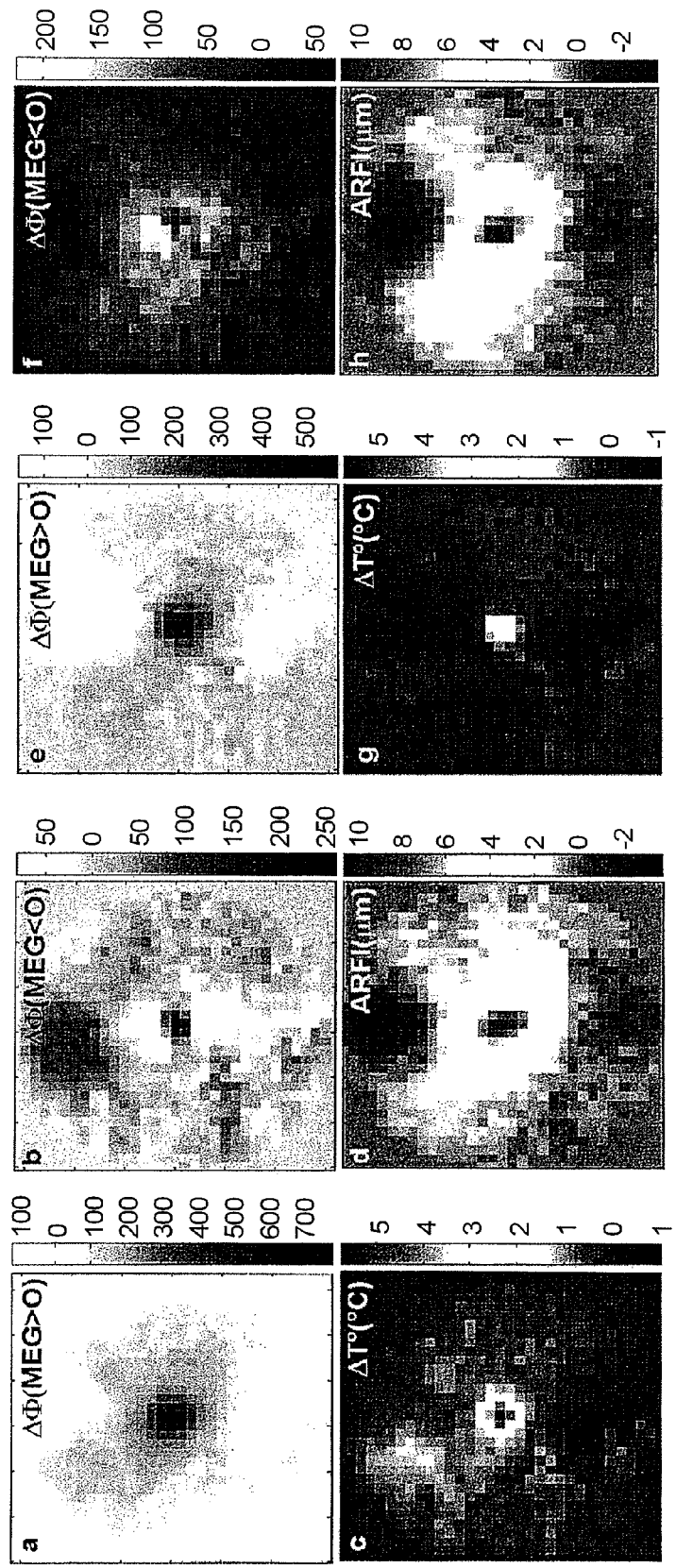
FIG. 3 shows two examples of image sets acquired in accordance with the present invention.

FIG. 3 shows a first set (images a, b, c and d) obtained after subtraction of reference phase background (i.e, no HIFU) bursts for positive MEG polarity (image a), negative MEG polarity (image b), temperature differential $\Delta T°$ (° C.) (image c), and ARFI (image d). Images a, b, c, and d are for FOVz=FOVx, with a reconstruction matrix size of 128×128. Images e, f, g, and h have content comparable to images a, b, c and d, but for FOVz=65% FOVx and a matrix size of 84×128, and a partial Fourier reconstruction factor of 6/8.

In the first experiment (FIG. 3, images a, b, c, d), the measured displacement at focus was $\Delta_y$=10.23 µm whereas the measured T° elevation at focus was $\Delta T_{max}$=5.78° C. In the second experiment (FIG. 3, images e, f, g, h), $\Delta y$=10.71 µm and $\Delta T_{max}$=3.07° C.

It should be noted that instead of temporal subtraction of reference data set (i.e. no HIFU) one can use for each phase image a reference-less subtraction of background phase according to the approach initially used for MR thermometry by Rieke et at (Rieke V, 2004, Mag Res Med, 51, 1223-31) and improved by Salomir et al (Proceedings ISMRM 2010, Abstract number # 247; unpublished German patent application DE 10 2009 058 510.9 filed in Germany on Dec. 16, 2009. The reference-less background phase to be subtracted for isolating the phase shift spatial contrast is calculated from a subset of pixels in image situated sufficiently distant from the focal point.

The displacement values in tissue in this experiment are in agreement with previously published data noted above. By reducing the number of acquired k-space lines from 128 (FOV$_Z$. FOV$_X$ full k-space) to 63 (FOV$_z$=65% FOV$_X$ and PF=75%) the number of synchronized HIFU shots, i.e. the localized energy deposition, hence $\Delta T_{max}$, was reduced by a factor of 1.88 that is equal to the predicted factor (128/63=2.03) within the noise standard deviation (SD). This also improved by a factor of 2.03 the temporal resolution, without penalty on spatial resolution nor on ARFI CNR. The balance between ARFI contrast and energy deposition depends on the number of MR excitation RF pulses (equal to the number of HIFU bursts per image since HIFU burst is triggered by the MR sequence). Thermal monitoring simultaneous to ARFI is a valuable safely tool. To date, using a simple PF-GRE-ARFI sequence (PF=partial Fourier), ARFI can localize in seconds HIFU focal spots with sufficient CNR ($\approx$11 at focus) and low T° elevation (+3° C.). However, a CNR similar to ARFI was obtained by PRFS MRT alone, considering for instance in situ optimization of focusing. Nevertheless, the current sequence measures tissue displacement hence tissue stiffness, allowing one to investigate pre- and post-therapeutic tissues changes. Energy deposition can be further reduced (while maintaining identical CNR in ARFI), using even more efficient 2D or 3D k-space filling strategies such as GRE-EPI kernel and/or parallel imaging.

One ARFI sequence was proposed by McDanold et al (3) for MR elastography purposes and therefore using bipolar MEG and spin echo refocusing of spectroscopic phase changes i.e it is insensitive to T°.

Their sequence may allow HIFU localization and stiffness-weighted images and with presumed slow acquisition time, since only reduced FOV acquisition is proposed. Moreover, the technique is not compatible with EPI or parallel imaging techniques since only 1D data set is reconstructed with 1D FFT at one step.

In accordance with the invention, precise localization of the HIFU focal point is obtained by subtracting GRE phase images from two independent acquisitions, with the ARF-induced phase shift being sequentially encoded with a positive monopolar MEG pulse and a negative monopolar MEG pulse, and by increasing the acquisition speed with GRE-EPI, parallel imaging techniques and partial Fourier reconstruction to provide subsequent heating reduction (less HIFU pulses than MR collected signals and/or MR reconstruction matrix size).

The "GRE" abbreviation stands in this patent for any type of gradient-echo (also called gradient-recalled echo) acquisition technique, including:

FLASH type (one k-space line reading per RF excitation)
single shot EPI
segmented EPI (also called multi-shot EPI)

Moreover, the setup covers 2D or 3D k-space filling using GRE.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for localizing a high intensity focused ultrasound (HIFU) focal point in magnetic resonance guided HIFU, comprising the steps of:
   with a magnetic resonance data acquisition unit in which an examination subject is located, acquiring magnetic resonance from the examination subject with a first GRE magnetic resonance pulse sequence that comprises a positive monopolar gradient pulse followed by sonification of the examination subject with HIFU overlapping with activation of a motion encoding gradient, said HIFU causing an acoustic radiation force phase shift and PRFS temperature-induced phased shift of magnetic resonance signals arising in the examination subject, to produce a first imaging data set;
   in parallel with scanning of the examination subject with said first GRE sequence, acquiring magnetic resonance from the examination subject with a second GRE magnetic resonance pulse sequence that comprises a negative monopolar gradient pulse followed by said sonification of the examination subject with HIFU overlapping with activation of a motion encoding gradient in said second GRE sequence, said HIFU causing an acoustic radiation force-induced phase shift and PRFS temperature-induced phase shift of magnetic resonance signals arising in the examination subject in said second GRE sequence, to produce a second imaging data set;
   in a processor, using Fourier reconstruction or partial Fourier reconstruction, reconstructing a first GRE phase image from said first image data set and reconstructing a second GRE phase image from said second image data set;
   in said processor, forming a subtraction image as a difference between said first GRE phase image and said second GRE phase image;
   in said processor, from said subtraction image, identifying a location and/or an acoustic intensity and/or a shape of said HIFU focal point;
   in said processor, forming an average image of said first GRE phase image and said second GRE phase image; and
   from said average image, monitoring temperature at the location of said HIFU focal point.

2. A method as claimed in claim 1 comprising activating said positive monopolar gradient pulse, said second monopolar gradient pulse and said motion encoding gradient along the main direction of propagation of HIFU beam in each of said first and second GRE sequences.

3. A method as claimed in claim 1 comprising identifying said location of said focal point and simultaneous measurement of local temperature elevation using said first and second GRE phase images.

4. A method as claimed in claim 1 comprising acquiring magnetic resonance from said examination subject with said first and second GRE sequences in a field of view that is reduced so as to encompass only a local region surrounding an expected location of said HIFU focal point. This includes in particular use of parallel imaging with multiple coils or use of asymmetrical (e.g. rectangular) field of view.

5. A method as claimed in claim 1 comprising scanning said examination subject with first and second GRE sequence and extracting the spatial contrast of phase shift in each image by using subtraction of reference-less background phase, said background phase being calculated from a subset of pixels in the image which are sufficiently distant from said HIFU focal point.

6. An apparatus for localizing a high intensity focused ultrasound (HIFU) focal point in magnetic resonance guided HIFU, comprising the steps of:
   a magnetic resonance data acquisition unit adapted to receive an examination subject therein;
   a control unit being configured to operate said data acquisition unit to scan the examination subject with a first GRE magnetic resonance pulse sequence that comprises a positive monopolar gradient pulse followed by sonification of the examination subject with HIFU overlapping with activation of a motion encoding gradient, said HIFU causing an acoustic radiation force phase shift of magnetic resonance signals arising in the examination subject, to produce a first imaging data set;
   said control unit being configured to operate said data acquisition unit to scan the examination subject with a second GRE magnetic resonance pulse sequence in parallel with irradiation of the examination subject with said first GRE sequence said second GRE sequence comprising a negative monopolar gradient pulse followed by said sonification of the examination subject with HIFU overlapping with activation of a motion encoding gradient in said second GRE sequence, said HIFU causing an acoustic radiation force-induced phase shift and a PRFS temperature-induced phase shift of magnetic resonance signals arising in the examination subject in said second GRE sequence, to produce a second imaging data set;

a processor configured to use Fourier reconstruction or partial Fourier reconstruction to reconstruct a first GRE phase image from said first image data set and to reconstruct a second GRE phase image from said second image data set;

said processor being configured to form a subtraction image as a difference between said first GRE phase image and said second GRE phase image and, from said subtraction image, identify a location and/or an acoustic intensity and/or a shape of said HIFU focal point;

said processor being configured to form an average image of said first GRE phase image and said second GRE phase image; and a display at which said processor is configured to display said average image in a form indicating temperature at the location of said HIFU focal point.

7. An apparatus as claimed in claim 6 wherein said control unit is configured to operate said data acquisition unit to activate said positive monopolar gradient pulse, said second monopolar gradient pulse and said motion encoding gradient along the main direction of propagation of HIFU beam in each of said first and second GRE sequences.

8. An apparatus as claimed in claim 6 wherein said processor is configured to identify said location of said focal point and to measure simultaneously local temperature elevation using said first and second GRE phase images.

9. An apparatus as claimed in claim 6 wherein said control unit is configured to operate said data acquisition unit to scan said examination subject with said first and second GRE sequences in a field of view that is reduced so as to encompass only a local region surrounding an expected location of said HIFU focal point. This includes in particular use of parallel imaging with multiple coils or use of asymmetrical (e.g. rectangular) field of view.

10. An apparatus as claimed in claim 6 where said control unit is configured to operate said acquisition unit to scan said examination subject with first and second GRE sequence and the spatial contrast of phase shift in each image is extracted by using subtraction of reference-less background phase, said background phase being calculated from a subset of pixels in the image which are sufficiently distant from said HIFU focal point.

* * * * *